US012089365B2

(12) United States Patent
Huang et al.

(10) Patent No.: US 12,089,365 B2
(45) Date of Patent: Sep. 10, 2024

(54) SMART COOLING FAN SYSTEM (71) Applicant: LANNER ELECTRONICS INC., New Taipei (TW)

(72) Inventors: Yueh-Se Huang, Taoyuan (TW); Kuo-Liang Shen, New Taipei (TW)

(73) Assignee: LANNER ELECTRONICS INC., New Taipei (TW)

( * ) Notice: Subject to any disclaimer, the term of this patent is extended or adjusted under 35 U.S.C. 154(b) by 211 days.

(21) Appl. No.: 17/842,479

(22) Filed: Jun. 16, 2022

(65) Prior Publication Data
US 2023/0070920 A1 Mar. 9, 2023

(30) Foreign Application Priority Data

Aug. 27, 2021 (TW) .................. 110131921

(51) Int. Cl.
*H05K 7/20* (2006.01)
*G06F 1/20* (2006.01)

(52) U.S. Cl.
CPC .......... *H05K 7/20209* (2013.01); *G06F 1/20* (2013.01); *H05K 7/20136* (2013.01); *G06F 2200/201* (2013.01)

(58) Field of Classification Search
CPC .......... H05K 7/20209; H05K 7/20136; H05K 7/20727; G06F 1/20; G06F 2200/201; G06F 1/206

USPC .......................................... 361/153
See application file for complete search history.

(56) References Cited

U.S. PATENT DOCUMENTS

| | | | |
|---|---|---|---|
| 2007/0124574 A1* | 5/2007 | Goldberg | G06F 1/206 713/100 |
| 2007/0219756 A1* | 9/2007 | Frankel | H05K 7/20209 700/304 |
| 2016/0266560 A1* | 9/2016 | Chou | G05B 19/106 |
| 2017/0219240 A1* | 8/2017 | Cassini | G06F 1/206 |
| 2017/0336839 A1* | 11/2017 | Ho | G05B 19/406 |

* cited by examiner

*Primary Examiner* — Thienvu V Tran
*Assistant Examiner* — Sreeya Sreevatsa (57) ABSTRACT

A smart cooling fan system is disclosed, and comprises temperature sensors, a first cooling fan connected to a main processor of an electronic device, a second cooling fan disposed in a housing case of the electronic device, and a microcontroller. The microcontroller is configured to, based on immediate fan rotation speed, find out a first volumetric flow rate and a second volumetric flow rate by looking up a cubic feet per minute (CFM)-RPM lookup table (LUT), a first pulse width modulation (PWM) LUT and a second PWM LUT, the microcontroller controls the first cooling fan to produce a first airflow having the first volumetric flow rate, and also controls the second cooling fan to produce a second airflow having the second volumetric flow rate.

14 Claims, 5 Drawing Sheets

SMART COOLING FAN SYSTEM

BACKGROUND OF THE INVENTION

1. Field of the Invention

The present invention relates to the technology field of cooling fan, and more particularly to a smart cooling fan system capable of adaptively modulating fan rotation speed according to CPU temperature and ambient temperature.

2. Description of the Prior Art

Computing devices, for example, desktop computer, all-in-one computer, laptop computer, industrial computer, and server, are well known becoming essential electronic devices for people and companies. Moreover, it should be known that, there are multiple cooling fans disposed in the foregoing electronic device for keeping or reducing the operating temperature of electronic chips and electronic modules disposed in a housing case of the electronic device through heat transfer, so as to prevent the electronic chips and/or the electronic modules from thermal shutdown. The electronic chips include CPU, GUP and/or digital signal processor (DSP), and the electronic modules at least include DRAM. In addition, according to conventional technologies, there is at least one temperature sensor disposed in the housing case of the electronic device for sensing an ambient temperature. As such, it is able to adaptively modulate the rotation speed of at least one cooling fan according to the ambient temperature, so as to keep or further reduce the operating temperature of electronic chips and electronic modules accommodated in the housing case.

For example, a method for optimizing fan speed control is developed for use in controlling a cooling fan system that is disposed in a housing case of a computer. The cooling fan system comprising a cooling fan, a control unit and a temperature sensor are disposed in the housing case, of which the temperature sensor is used for sensing an ambient temperature consisting of a first temperature (i.e., operating temperature) sensed from a CPU and a second temperature sensed from at least one electronic component/module (i.e., device temperature). On the other hand, the control unit, e.g., a baseboard management controller (BMC) chip, is coupled to the temperature sensor, and is provided with a temperature-duty cycle lookup table (LUT) therein. Moreover, the BMC chip is configured to find out a fan rotation speed corresponding to the ambient temperature sensed by the temperature sensor from the temperature-duty cycle LUT, thereby adaptively changing the rotation speed of the cooling fan to meet the fan rotation speed by modulating the duty cycle of a PWM signal transmitted to the cooling fan.

In real case, different electronic chips and/or electronic modules certainly have unequal operating temperature at different operation states. For example, the CPU's operating temperature rises to 80-90 degrees Celsius or even more than 90 degrees Celsius in case of the CPU utilization is 60-80%. However, the operating temperature of a normal-operation hard disk drive may be merely 40 degrees Celsius, and the operating temperature of a GPU that is executing a normal graphic computing is merely 50 degrees Celsius. In such case, because the conventional fan speed controlling method optimizes the cooling fan's rotation speed according to the ambient temperature rather than the CPU's operating temperature, the fan speed controlling method fails to specifically reduce the CPU's operating temperature by merely changing the rotation speed of a CPU cooling fan.

Accordingly, because there is room from improvement in the conventional fan speed controlling method, an improved fan speed controlling method is therefore developed and provided. According to the improved fan speed controlling method, there are two temperature sensors disposed near a CPU and a GPU, respectively, and the temperature sensors are coupled to a BMC chip. By such arrangements, the BMC chip is able to specifically change the rotation speed of a CPU cooling fan according to a CPU temperature sensed by the temperature sensor, and can also specifically change the rotation speed of a GPU cooling fan according to a GPU temperature sensed by the temperature sensor. In other words, the improved fan speed controlling method corrects the drawbacks of the above-mentioned fan speed controlling method However, it is a pity that the proposed improved fan speed controlling method still exhibits some drawbacks in practical use. The drawbacks are summarized in following paragraphs.

(1) BMC chip is commonly used for monitoring the state of power supply and electronic modules of a host electronic device like server. When the improved fan speed controlling method is applied in the host electronic device, almost all of GPIO pins of the BMC chip are coupled to the multiple cooling fans, causing that some functionalities of the BMC chip cannot be used. Therefore, it needs to add extra one or more BMC chips in the host electronic device, such that the manufacturing cost of the host electronic device is increased.

(2) The conventional fan speed controlling method utilizes closed-loop control in combination with accessing temperature-duty cycle lookup table (LUT) to adjust the rotation speed of the cooling fan step by step. For example, adjusting the rotation speed of the cooling fan through time-by-time increasing the duty cycle of the PWM signal with an increment of 10% (i.e., 10%→20%→, . . . , →100%). However, such duty cycle modulation way fails to reduce the CPU's operating temperature immediately. In real case, the CPU's operating temperature would abruptly rises to 80-90 degrees Celsius as the CPU utilization increases to 60-80%. In such case, step-by-step modulating duty cycle obviously fails to reduce the CPU's operating temperature immediately, and also fails to prevent the CPU from thermal shutdown.

According to above descriptions, it is understood that that there are rooms for improvement in the conventional fan speed controlling method. In view of that, the inventor of the present application have made great efforts to make inventive research and eventually provided a smart cooling fan system.

SUMMARY OF THE INVENTION

The primary objective of the present invention is to disclose a smart cooling fan system, comprising: at least one first temperature sensor for sensing a first temperature form at least one main processor, at least one second temperature sensor for sensing a second temperature in a housing case that is accommodated the at least one main processor therein, at least one first cooling fan, at least one second cooling fan, and a microcontroller. According to the present invention, the microcontroller acquires an immediate rotation speed from said first cooling fan and said second cooling fan. Subsequently, after obtaining a first volumetric flow rate and a second volumetric flow rate by accessing a cubic feet per minute (CFM)-RPM lookup table (LUT), a first pulse width modulation (PWM) LUT and a second PWM LUT, the microcontroller controls the first cooling fan to produce a first airflow having the first volumetric flow rate, and also controls the second cooling fan to produce a second airflow having the second volumetric flow rate. As a result, the operating temperature of the main processor and an ambient temperature of the housing case are therefore immediately reduced and well-controlled.

It is worth mentioning that, because the microcontroller is a CPLD of a FPGA, the microcontroller has sufficient amount of pins to be simultaneously coupled all of the multiple temperature sensors and the multiple cooling fans, and is able to control the rotation speed of each said cooling fan.

For achieving the primary objective mentioned above, the present invention provides an embodiment of the smart cooling fan system, which is disposed in a housing case of an electronic device, and comprises:

at least one first cooling fan, being disposed in the housing case, and being installed on or near at least one electronic chip; wherein the at least one first cooling fan has a rotations per minute (RPM) signal outputting terminal and a pulse width modulation (PWM) signal inputting terminal;

at least one first temperature sensor, being disposed in the housing case for sensing a first temperature of the at least one electronic chip;

at least one second cooling fan, being disposed in the housing case, and being used for exhausting a hot air produced in the housing case or feeding an external air into the housing case; wherein the at least one second cooling fan also has a RPM signal outputting terminal and a PWM signal inputting terminal;

at least one second temperature sensor, being disposed in the housing case for sensing a second temperature of an inner space of the housing case; and a microcontroller, having a memory and being selected from a group consisting of complex programmable logic device (CPLD) and field programmable gate array (FPGA), and being coupled to the at least one first temperature sensor, the at least one temperature sensor, the RPM signal outputting terminal and the PWM signal inputting terminal of the at least one first cooling fan, and the RPM signal outputting terminal and the PWM signal inputting terminal of the at least one second cooling fan;

wherein the memory stores a plurality of lookup tables, and the plurality of lookup tables comprising:

three first lookup tables, wherein one of the three first lookup table records, corresponding to the at least one first cooling fan, a plurality of first volumetric flow rates and a plurality of first fan rotation speed corresponding to the plurality of first volumetric flow rates, and one of the three first lookup tables records, corresponding to the at least one second cooling fan, a plurality of second volumetric flow rates and a plurality of second fan rotation speed corresponding to the plurality of second volumetric flow rates;

a second lookup table, recording L number of first duty cycle analog values and L number of first temperature values corresponding to the L number of first duty cycle analog values, L being a positive integer; and a third lookup table, also recording M number of second duty cycle analog values and M number of second temperature values corresponding to the M number of second duty cycle analog values, M being a positive integer;

wherein during a normal operation of the at least one first cooling fan and the at least one second cooling fan, the microcontroller receiving a first immediate rotation speed of the at least one first cooling fan and a second immediate rotation speed of the at least one second cooling fan;

wherein after receiving a data of the first temperature sensed by the at least one first temperature sensor, the microcontroller finding out one of the L number of first duty cycle analog values corresponding to the first temperature value from the second lookup table, and then generating and transmitting, according to the first duty cycle analog value, a first PWM signal with a first duty cycle to the PWM signal inputting terminal of the at least one first cooling fan, thereby controlling the at least one first cooling fan to produce a first airflow with one of the plurality of first volumetric flow rates;

wherein after receiving a data of the second temperature sensed by the at least one second temperature sensor, the microcontroller finding out one of the M number of second duty cycle analog values corresponding to the second temperature value from the third lookup table, and then generating and transmitting, according to the second duty cycle analog value, a second PWM signal a with a second duty cycle to the PWM signal inputting terminal of the at least one second cooling fan, thereby controlling the at least one second cooling fan to produce a second airflow with one of the plurality of second volumetric flow rates.

In one embodiment, the at least one electronic chip is selected from a group consisting of CPU, GPU, digital signal processor (DSP), and application processor.

In one practicable embodiment, one said electronic chip is a CPU, and another one said electronic chip is GPU, and two said first temperature sensors includes a first thermal diode coupled to the CPU and a second thermal diode coupled to the GPU. Moreover, the microcontroller communicates with the CPU and the GPU through PECI protocol, so as to receive a data of a CPU temperature sensed by the first thermal diode from the CPU as well as receive a data of a GPU temperature sensed by the second thermal diode from the GPU.

In another one practicable embodiment, one said electronic chip is a CPU, and another one said electronic chip is GPU, and two said first temperature sensors includes a first thermal diode integrated in the CPU and a second thermal diode integrated in the GPU. Moreover, the microcontroller communicates with the CPU and the GPU through PECI protocol, so as to receive a data of a CPU temperature sensed by the first thermal diode from the CPU as well as receive a data of a GPU temperature sensed by the second thermal diode from the GPU.

In one embodiment, a readout chip is coupled the microcontroller, the RPM signal outputting terminal and the PWM signal inputting terminal of the at least one first cooling fan, and the RPM signal outputting terminal and the PWM signal inputting terminal of the at least one second cooling fan, such that the microcontroller receives the first immediate rotation speed of the at least one first cooling fan and the second immediate rotation speed of the at least one second cooling fan through the readout chip.

In a practicable embodiment, the smart cooling fan system of the present invention further comprises:

at least one third cooling fan, being disposed in the housing case, and being installed on or near at least one electronic module; wherein the at least one third cooling fan also has a RPM signal outputting terminal and a PWM signal inputting terminal;

at least one third temperature sensor, being disposed in the housing case for sensing a third temperature of the at least one electronic module;

wherein one of the three first lookup tables records, corresponding to the at least one third cooling fan, a plurality of third volumetric flow rates and a plurality of third fan rotation speed corresponding to the plurality of third volumetric flow rates;

wherein the plurality of lookup tables further comprises a fourth lookup table, recording N number of third duty cycle analog values and N number of third temperature values corresponding to the N number of third duty cycle analog values, N being a positive integer;

wherein during a normal operation of the at least one third cooling fan, the microcontroller receiving a third immediate rotation speed of the at least one third cooling fan;

wherein after receiving a data of the third temperature sensed by the at least one third temperature sensor, the microcontroller finding out one of the M number of third duty cycle analog values corresponding to the third temperature value from the fourth lookup table, and then generating and transmitting, according to the third duty cycle analog value, a third PWM signal with a third duty cycle to the PWM signal inputting terminal of the at least one third cooling fan, thereby controlling the at least one third cooling fan to produce a third airflow with one of the plurality of third volumetric flow rates.

In one embodiment, the electronic module is selected from a group consisting of DRAM, hard disk drive and LED lighting device, and the at least one electronic chip is selected from a group consisting of CPU, GPU, digital signal processor (DSP), and application processor.

In a practicable embodiment, the smart cooling fan system of the present invention further comprises: a management unit coupled to a basic input/output system (BIOS) chip of the electronic device, wherein the management unit is used for communicating with an external electronic device, such that the external electronic device writes the three first lookup tables, the second lookup table, the third lookup table, and the fourth lookup table into a storage space of the BIOS chip.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a smart cooling fan system, embodiments of the present invention will be described in detail with reference to the attached drawings hereinafter.

First Embodiment

Figure 1:
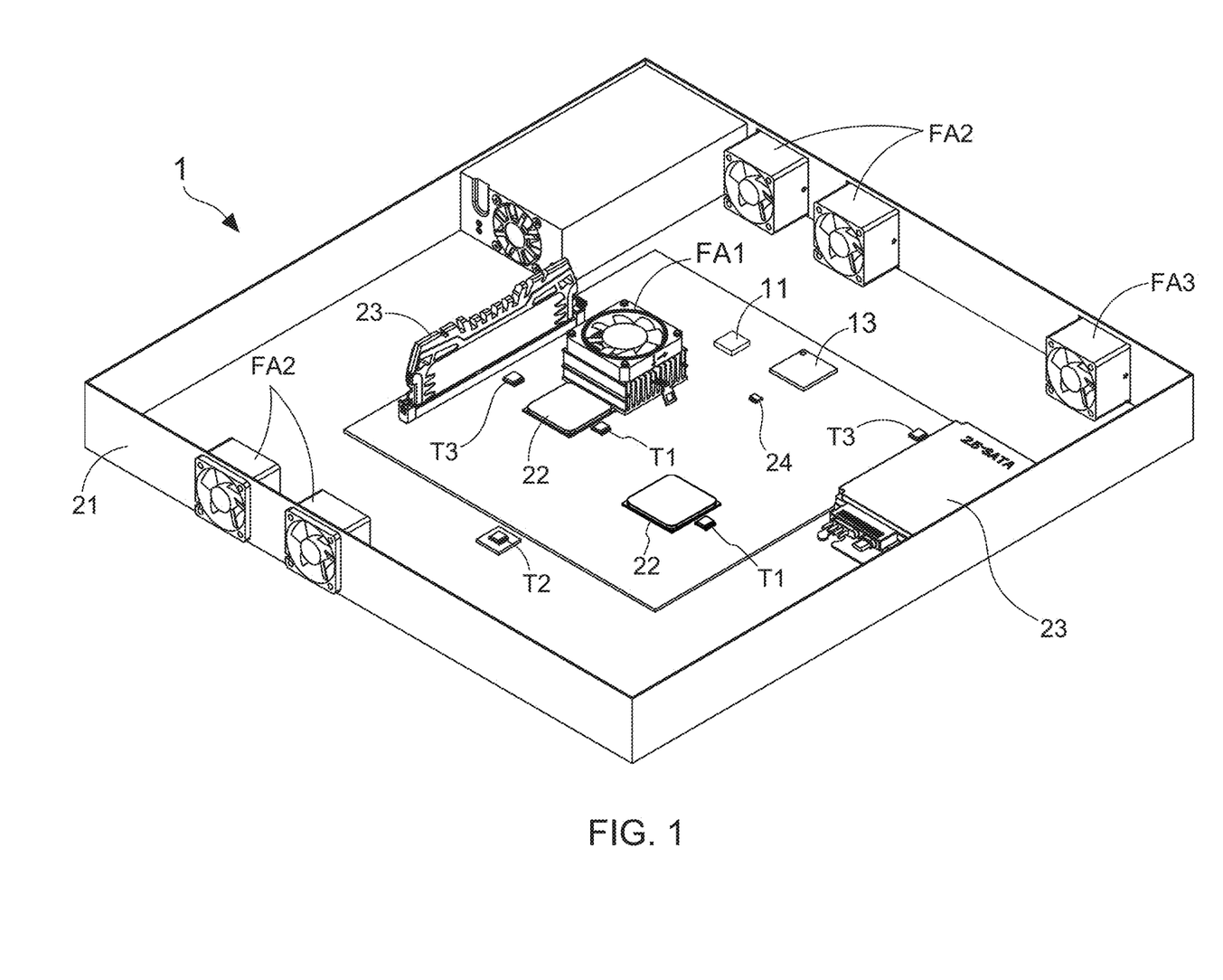
FIG. 1 shows a first elevation view of a housing case accommodating a smart cooling fan system of the present invention therein.

With reference to FIG. 1, there is a first elevation view of a housing case accommodating a smart cooling fan system of the present invention therein. As FIG. 1 shows, the smart cooling fan system 1 of the present invention is disposed in a housing case 21 of an electronic device, and comprises: at least one first cooling fan FA1, at least one second cooling fan FA2, at least one third cooling fan FA3, a readout chip 11, at least one first temperature sensor T1, at least one second temperature sensor T2, at least one third temperature sensor T3, and a microcontroller 13. According to the present invention, the at least one first cooling fan FA1 is disposed in the housing case 21, and is installed on or near at least one electronic chip 22 that is accommodated in the housing case 21, wherein the at least one first cooling fan FA1 has a RPM signal outputting terminal FA12 and a PWM signal inputting terminal FA11. In one embodiment, one said electronic chip 22 is a CPU, and another one said electronic chip 22 is GPU. It is known that, the operating temperature of the CPU (GPU) would vary dramatically with the CPU (GPU) utilization. For example, the CPU's operating temperature rises to 80-90 degrees Celsius or even more than 90 degrees Celsius in case of the CPU utilization is 60-80%. Of course, the at least one electronic chip 22 can also be a digital signal processor (DSP) or an application processor in other practicable embodiments.

According to FIG. 1, the at least one second cooling fan FA2 is disposed in the housing case 21, and is used for regulating an inner ambient temperature of the housing case 21. Therefore, the at least one second cooling fan FA2 is commonly disposed on a front-side plate or a rear-side plate of the housing case 21, and is arranged to face the inner space of the housing case 21 by an air-intake side thereof. Moreover, an air-exhausting side of the at least one second cooling fan FA2 is exposed out of the housing case 21, such that the at least one second cooling fan FA2 is controlled to exhaust a hot air produced in the housing case 21. On the other hand, by arranging the at least one second cooling fan FA2 to face the inner space of the housing case 21 by the air-exhausting side, the at least one second cooling fan FA2 can be controlled to feed an external air into the housing case 21. Similarly, the at least one second cooling fan FA2 also has a RPM signal outputting terminal FA22 and a PWM signal inputting terminal FA21.

As FIG. 1 shows, the at least one third cooling fan FA3 is disposed in the housing case 21, and is installed on or near at least one electronic module 23. In practicable embodiments, the at least one electronic module 23 can be a DRAM, a hard disk drive and/or an LED lighting device accommodated in the housing case 21. Moreover, the at least one second cooling fan FA3 also has a RPM signal outputting terminal FA32 and a PWM signal inputting terminal FA31. It needs to further explain that, this smart cooling fan system 1 can be integrated into any one type of electronic device, such as server, cloud computing device, industrial computer, desktop computer, laptop computer, and all-in-one computer.

Figure 2:
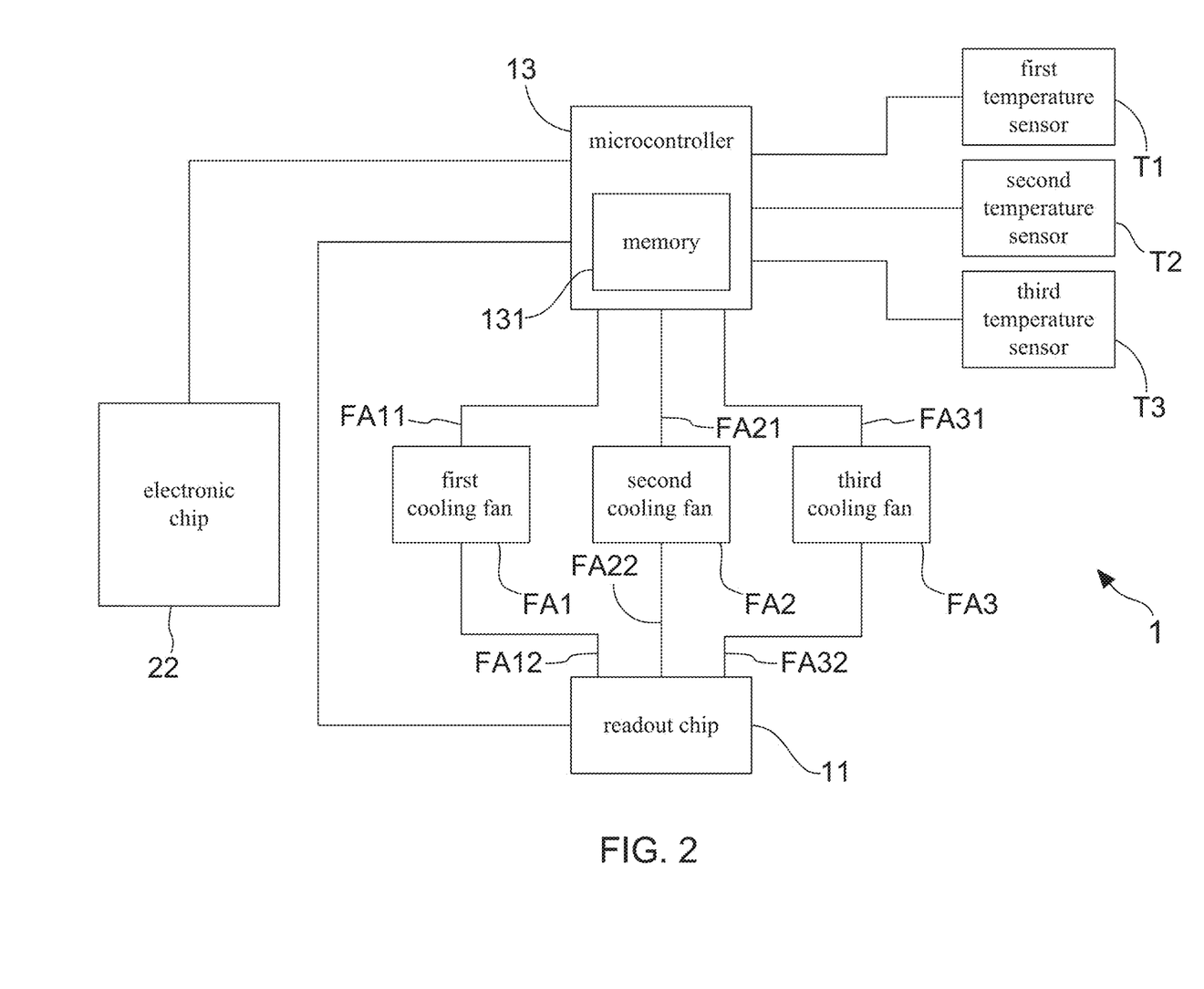
FIG. 2 shows a first block diagram of the smart cooling fan system according to the present invention.

Please continuously refer to FIG. 1, and simultaneously refer to FIG. 2 showing a first block diagram of the smart cooling fan system according to the present invention. According to FIG. 1 and FIG. 2, the readout chip 11 is coupled the microcontroller 13, the RPM signal outputting terminal FA12 of the at least one first cooling fan FA1, the RPM signal outputting terminal FA22 of the at least one second cooling fan FA2, and the RPM signal outputting terminal FA32 of the at least one third cooling fan FA3. It should be known that, commercial cooling fan is commonly designed to have four signal wires, including: DC voltage inputting wire, ground wire, PWM signal inputting wire, and RPM signal outputting wire. Therefore, foregoing descriptions have introduced that the at least one first cooling fan FA1, the at least one second cooling fan FA2 and the at least one third cooling fan FA3 all have a RPM signal outputting terminal and a PWM signal inputting terminal. On the other hand, the at least one first temperature sensor T1 is disposed in the housing case 21 for sensing a first temperature of the at least one electronic chip 22, the at least one second temperature sensor T2 is disposed in the housing case 21 for sensing a second temperature of an inner space of the housing case 21, and the at least one third temperature sensor T3 is disposed in the housing case 21 for sensing a third temperature of the at least one electronic module 23.

Figure 3:
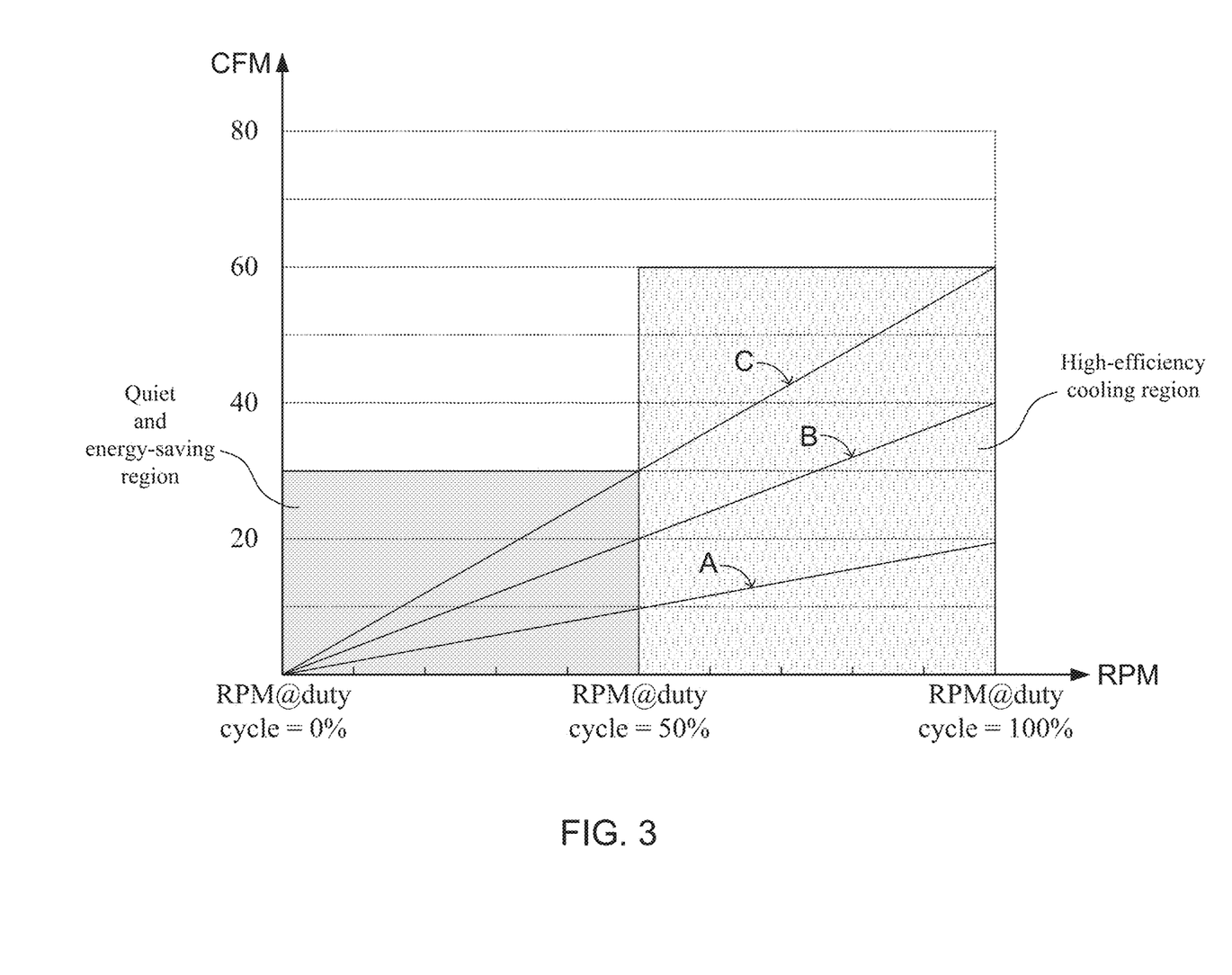
FIG. 3 shows a curve graph of CFM versus RPM.

According to FIG. 1 and FIG. 2, the microcontroller 13 is coupled to the readout chip 11 as well as the first temperature sensor T1, the second temperature sensor T2 and the third temperature sensor T3. Moreover, the microcontroller 13 is also coupled to the PWM signal inputting terminal FA 11 of the at least one first cooling fan FA1, the PWM signal inputting terminal FA21 of the at least one second cooling fan FA2, and the PWM signal inputting terminal FA31 of the at least one third cooling fan FA3. Particularly, the memory 131 is designed to store a plurality of lookup tables, and the plurality of lookup tables comprises three first lookup table (LUTs), a second LUT, a third LUT, and a fourth LUT. To be more specific, one of the three first LUTs records, corresponding to the at least one first cooling fan FA1, a plurality of first volumetric flow rates (i.e., cubic feet per minute (CFM) values) and a plurality of first fan rotation speed corresponding to the plurality of first volumetric flow rates, and one of the three first LUTs records, corresponding to the at least one second cooling fan FA2, a plurality of second volumetric flow rates (i.e., CFM values) and a plurality of second fan rotation speed corresponding to the plurality of second volumetric flow rates. Moreover, the last one of the three first LUTs records, corresponding to the at least one third cooling fan FA3, a plurality of third volumetric flow rates (i.e., CFM values) and a plurality of third fan rotation speed corresponding to the plurality of third volumetric flow rates. It is aware that, air flow is the volume of air that is produced by each of the first cooling fan FA1, the second cooling fan FA2 and third cooling fan FA3 measured by time. In this case, the air flow of the first cooling fan FA1, the second cooling fan FA2 and the third cooling fan FA3 is measured in cubic feet per minute (CFM) in imperial units. Therefore, CFM is adopted for representing a volumetric flow rate of each of the first cooling fan FA1, the second cooling fan FA2 and the third cooling fan FA3. Moreover, the second LUT records L number of first duty cycle analog values (e.g., 0~255) and L number of first temperature values corresponding to the L number of first duty cycle analog values. On the other hand, the third LUT also records M number of second duty cycle analog values and M number of second temperature values corresponding to the M number of second duty cycle analog values. Besides, the fourth LUT also records N number of second duty cycle analog values and N number of second temperature values corresponding to the N number of second duty cycle analog values. L, M and N are all positive integer. FIG. 3 shows a curve graph of CFM versus RPM. Curve A in FIG. 3 is measured by completing following steps: inputting a constant DC voltage to the DC voltage inputting wire of a No. A cooling FAN having a maximum airflow capacity of 20 CFM; and adjusting the rotation speed of the cooling fan through time-by-time increasing the duty cycle of the PWM signal that is transmitted to the PWM signal inputting wire with a constant increment (e.g., 10%→20%→, . . . , →100%). Similarly, curve B in FIG. 3 is measured by completing following steps: inputting a constant DC voltage to the DC voltage inputting wire of a No. B cooling FAN having a maximum airflow capacity of 40 CFM; and adjusting the rotation speed of the cooling fan through time-by-time increasing the duty cycle of the PWM signal that is transmitted to the PWM signal inputting wire with a constant increment (e.g., 10%→20%→, . . . , →100%).

Moreover, curve C in FIG. 3 is measured by completing following steps: inputting a constant DC voltage to the DC voltage inputting wire of a No. C cooling FAN having a maximum airflow capacity of 60 CFM; and adjusting the rotation speed of the cooling fan through time-by-time increasing the duty cycle of the PWM signal that is transmitted to the PWM signal inputting wire with a constant increment (e.g., 10%→20%→, . . . , →100%). According to FIG. 3, it is found that curves A-C have a first slope, a second slope and a third slope, respectively, of which the third slope is greater than the second slope, and the second slope is greater than the first slope. In other words, in case of making the duty cycle of the PWM signal rise from P % to Q % (e.g., 30%→50%), the airflow volume increment of the No. C cooling fan is larger than that of the No. B cooling fan, and the airflow volume increment of the No. B cooling fan is larger than that of the No. A cooling fan. It should be understood that, the airflow volume is directly correlated with the cooling ability (heat dissipation ability) of a cooling FAN.

Herein, it needs to be further explain that, CFM stands for cubic feet per minute (it is also referred to as airflow). Put simply, CFM is how much air a fan moves. The measurement is taken when the cooling fan is on a specified speed and uses both the volume of air and the rate at which it moves. For example, a commercial CPU cooling fan (i.e., said first cooling fan FA1) has the maximum airflow capacity of 30-40 CFM, a commercial computer case fan (i.e., said second cooling fan FA2) has the maximum airflow capacity of 60-120 CFM, and a commercial DRAM cooling fan (i.e., said third cooling fan FA3) has the maximum airflow capacity of 20-25 CFM. Therefore, after measuring CFM-RPM curves of the at least one first cooling fan FA1, the at least one second cooling fan FA2 and the at least one cooling fan FA3, duty cycle-CFM curves of the at least one first cooling fan FA1, the at least one second cooling fan FA2 and the at least one cooling fan FA3, duty cycle-CFM are simultaneously obtained. Subsequently, a duty cycle-duty cycle analog value lookup table (LUT) shown as follows can be generated according to one duty cycle-CFM curve.

TABLE (1)

| Duty cycle (%) | Duty cycle analogue value |
|---|---|
| 0 | 0 |
| 39 | 100 |
| 59 | 150 |

TABLE (1)-continued

| Duty cycle (%) | Duty cycle analogue value |
| --- | --- |
| 78 | 200 |
| 100 | 255 |

After obtaining the duty cycle-duty cycle analog value LUT like above table (1), a duty cycle analog value-temperature LUT can be further generated as follows.

TABLE (2)

| Duty cycle analogue value | Temperature (° C.) |
| --- | --- |
| 0 | 0-49 |
| 100 | 50-59 |
| 150 | 60-69 |
| 200 | 70-89 |
| 255 | 80-89 |

It needs to further explain that, number of the switching level of the duty cycle of a PWM signal is not limited to 5 like the above-presented table (2) shows. In a practicable embodiment, the number of the switching level of the duty cycle can be set to 5, 7, or 10. Therefore, after setting the number of the switching level of the duty cycle, it can further decide a quiet and energy-saving region and a high-efficiency heat dissipation region on FIG. 3. When the smart cooling fan system 1 is operated in the quiet and energy-saving region, the at least one first cooling fan FA1, the at least one second cooling fan FA2 and the at least one cooling fan FA3 are controlled to have corresponding CFM value and RPM value. Similarly, after the at least one first cooling fan FA1, the at least one second cooling fan FA2 and the at least one cooling fan FA3 are controlled to have CFM value b and RPM value, the smart cooling fan system 1 is operated in the high-efficiency heat dissipation region. Of course, the temperature range corresponding to each said switching level of the duty cycle is also settable according to a real application condition.

In summary, the memory 131 of the microcontroller 13 stores a first LUT (i.e., CFM-RPM LUT), a second LUT (i.e., duty cycle analog values-temperature LUT), a third LUT (i.e., duty cycle analog values-temperature LUT), and, a fourth LUT (i.e., duty cycle analog values-temperature LUT). By such arrangements, during a normal operation of the at least one first cooling fan FA1, the at least one second cooling fan FA2 and the at least one third cooling fan FA3, the microcontroller 13 receives a first immediate rotation speed of the at least one first cooling fan FA1, a second immediate rotation speed of the at least one second cooling fan FA2 and a third immediate rotation speed of the at least one third cooling fan FA3 from the readout chip 11. Subsequently, after receiving a data of the first temperature sensed by the at least one first temperature sensor T1, the microcontroller 13 find out one of the L number of first duty cycle analog values corresponding to the first temperature value from the second LUT (e.g., table (2)), and then generates and transmits, according to the first duty cycle analog value, a first PWM signal with a first duty cycle to the PWM signal inputting terminal FA11 of the at least one first cooling fan FA1, thereby controlling the at least one first cooling fan FA1 to produce a first airflow with one of the plurality of first volumetric flow rates (e.g. 20 CFM).

Moreover, after receiving a data of the second temperature sensed by the at least one second temperature sensor T2, the microcontroller 13 finds out one of the M number of second duty cycle analog values corresponding to the second temperature value from the third LUT, and then generates and transmits, according to the second duty cycle analog value, a second PWM signal a with a second duty cycle to the PWM signal inputting terminal FA21 of the at least one second cooling fan FA2, thereby controlling the at least one second cooling fan FA2 to produce a second airflow with one of the plurality of second volumetric flow rates (e.g., 70 CFM). In addition, after receiving a data of the third temperature sensed by the at least one third temperature sensor T3, the microcontroller 13 finds out one of the N number of third duty cycle analog values corresponding to the third temperature value from the fourth LUT, and then generates and transmits, according to the third duty cycle analog value, a third PWM signal with a third duty cycle to the PWM signal inputting terminal FA31 of the at least one third cooling fan FA3, thereby controlling the at least one third cooling fan FA3 to produce a third airflow with one of the plurality of third volumetric flow rates (e.g., 20 CFM).

As described in more detail below, the second LUT (e.g., table (2)) is set for being accessed by the microcontroller 13 so as to control the CFM value and the RPM value of the first cooling fan FA1, and the second LUT records L number of first duty cycle analog values (e.g. 0~255) and L number of first temperature values corresponding to the L number of first duty cycle analog values. Moreover, the third LUT is set for being accessed by the microcontroller 13 so as to control the CFM value and the RPM value of the second cooling fan FA2, and the third LUT records M number of first duty cycle analog values (e.g. 0~255) and M number of first temperature values corresponding to the M number of first duty cycle analog values. On the other hand, the fourth LUT is set for being accessed by the microcontroller 13 so as to control the CFM value and the RPM value of the third cooling fan FA3, and the fourth LUT records N number of first duty cycle analog values (e.g. 0~255) and N number of first temperature values corresponding to the N number of first duty cycle analog.

As FIG. 1 and FIG. 2 show, the readout chip 11 is a decoder, and is configured for receiving a rotation speed sensing signal for the RPM signal outputting terminal FA12 of the at least one first cooling fan FA1, the RPM signal outputting terminal FA22 of the at least one second cooling fan FA2 or the RPM signal outputting terminal FA32 of the at least one third cooling fan FA3, and then converting the rotation speed sensing signal to a corresponding digital data transmitted to the microcontroller 13. In a practicable embodiment, the microcontroller 13 can be a CPLD chip or a FPGA chip.

In other words, the microcontroller 13 acquires an immediate rotation speed from the at least one first cooling fan FA1, the at least one second cooling fan FA2 and the at least one cooling fan FA3. Subsequently, after obtaining a first volumetric flow rate (i.e., CFM value for FA1), a second volumetric flow rate (i.e., CFM value for FA2) and a third volumetric flow rate (i.e., CFM value for FA3) by accessing a CFM-RPM lookup table (LUT), a first LUT, a second LUT and a third LUT, the microcontroller 13 controls the first cooling fan FA1 to produce a first airflow having the first volumetric flow rate, controls the second cooling fan FA2 to produce a second airflow having the second volumetric flow rate, and also controls the third cooling fan FA3 to produce a third airflow having the third volumetric flow rate. As a result, the operating temperature of the at least one electronic chip (i.e., CPU or GPU) 22, an ambient temperature of the housing case 21 and at least one electronic module (i.e., DRAM, HD, LED) 23 are therefore immediately reduced and well-controlled. For example, when the operating temperature of a CPU (i.e., one said electronic chip 22) abruptly rises to 80-90 degrees Celsius, the microcontroller 13 controls the three cooling fans (FA1, FA2, FA3) to immediately be operated in the high-efficiency cooling region, so as to reduce the operating temperature of the CPU in a short time period, thereby preventing the CPU from thermal shutdown. On the contrary, in case of the operating temperature of the CPU is decreasing with the CPU utilization, the microcontroller 13 controls the three cooling fans (FA1, FA2, FA3) to be immediately operated in the quiet and energy-saving region, so as to reduce noise of the three cooling fans (FA1, FA2, FA3) in a short time period.

In a real application case, the at least one first lookup table, the second lookup table, the third lookup table, and the fourth lookup table are stored in a storage space of the BIOS chip 24. BIOS is an abbreviation of basic input/output system. To be more specific, BIOS chip 24 is a fundamental component of an electronic device like computer or server (i.e., industrial computer), and is embedded in a motherboard to perform critical booting operations. It's the first piece of code executed by the electronic device when powered on, establishing a crucial communication bridge between the operating system and the hardware of the computer. Therefore, because a register is adopted as the memory 131 of the microcontroller 13, such that the at least one first lookup table, the second lookup table, the third lookup table, and the fourth lookup table are loaded into the memory 131 from the storage space of the BIOS chip 24 after the microcontroller 13 is awakened. It is worth explaining that, the microcontroller 13 selects and loads corresponding LUTs from the BIOS chip 24 into the register (i.e., memory 131) according to the model of the electronic chip 22 and the electronic module 23.

As described in more detail below, commercial CPU (GPU) is commonly coupled with a thermal diode, wherein this thermal diode is used for monitoring the operating temperature of the CPU (GPU). In such case, as FIG. 1 shows, two said electronic chips 22 are a CPU and a GPU, respectively, and two said first temperature sensors T1 includes a first thermal diode coupled to the CPU and a second thermal diode coupled to the GPU. Moreover, the microcontroller 13 communicates with the CPU and the GPU through PECI protocol, so as to receive a data of a CPU temperature sensed by the first thermal diode from the CPU as well as receive a data of a GPU temperature sensed by the second thermal diode from the GPU.

On the other hand, high-level CPU (GPU) is commonly integrated with a thermal diode therein. In such case, as FIG. 3 shows, two said electronic chip 22 are a CPU and a GPU, respectively, and two said first temperature sensors T1 includes a first thermal diode integrated in the CPU and a second thermal diode integrated in the GPU. Moreover, the microcontroller 13 communicates with the CPU and the GPU through PECI protocol, so as to receive a data of a CPU temperature sensed by the first thermal diode from the CPU as well as receive a data of a GPU temperature sensed by the second thermal diode from the GPU.

It is worth further explaining that, there is no need to calibrate the thermal diode (i.e., the first temperature sensor) integrated in a CPU (GPU) before utilizing the thermal diode to sense the operating temperature of the CPU (GPU). On the contrary, calibration is needed for the second temperature sensor T2 for monitoring the inner ambient temperature and the third temperature sensor T3 for monitoring the operating temperature of the electronic module 23. As described in more detail below, thermal resistor, having a base temperature (or called reference temperature), is adopted as the second temperature sensor T2 and the first temperature sensor, and it is necessary to calibrate the base temperature before utilizing the thermal resistor because the base temperature may vary with environment temperature.

Second Embodiment

Figure 4:
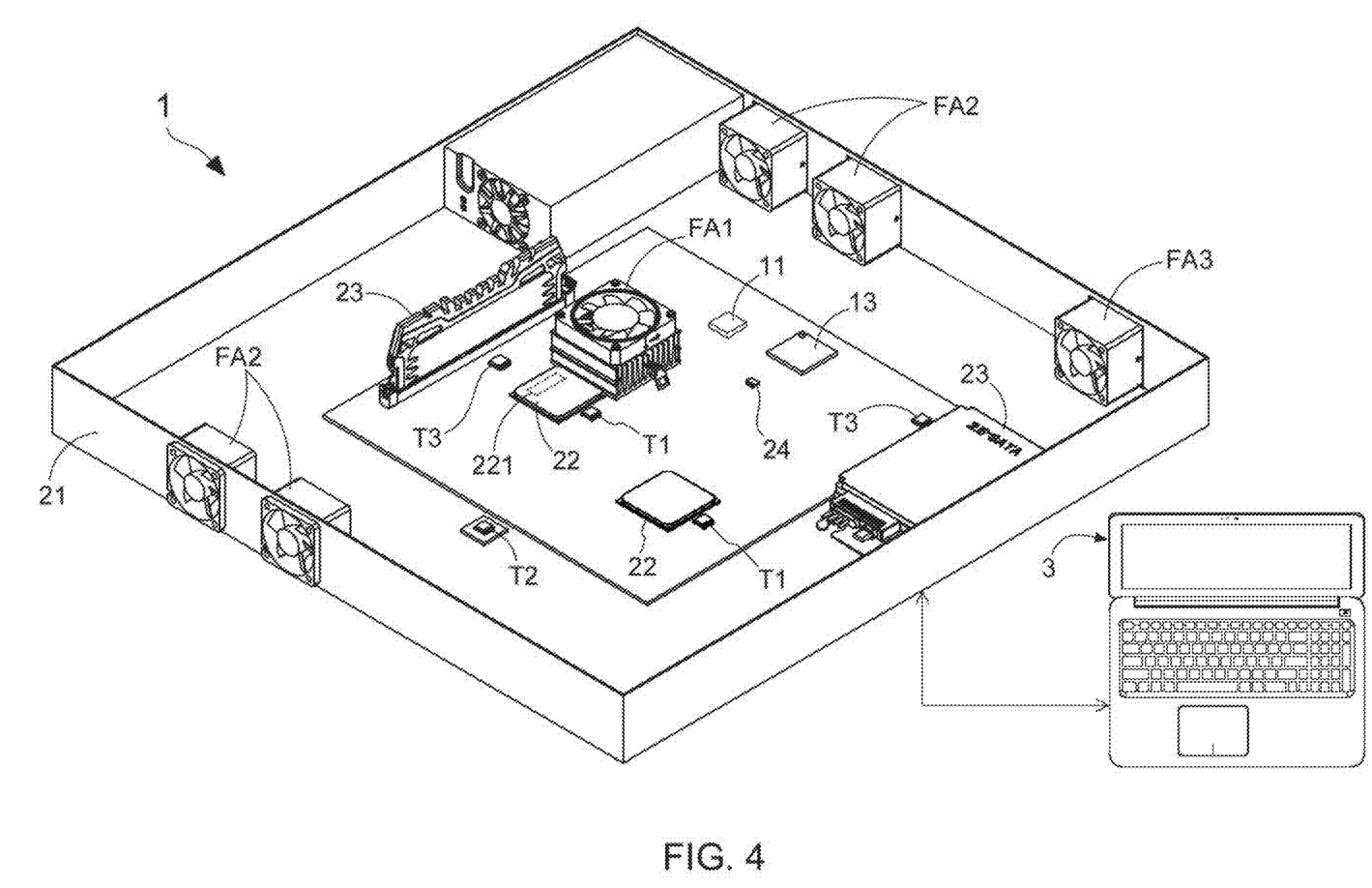
FIG. 4 shows a second elevation view of the housing case accommodating the smart cooling fan system of the present invention therein.
Figure 5:
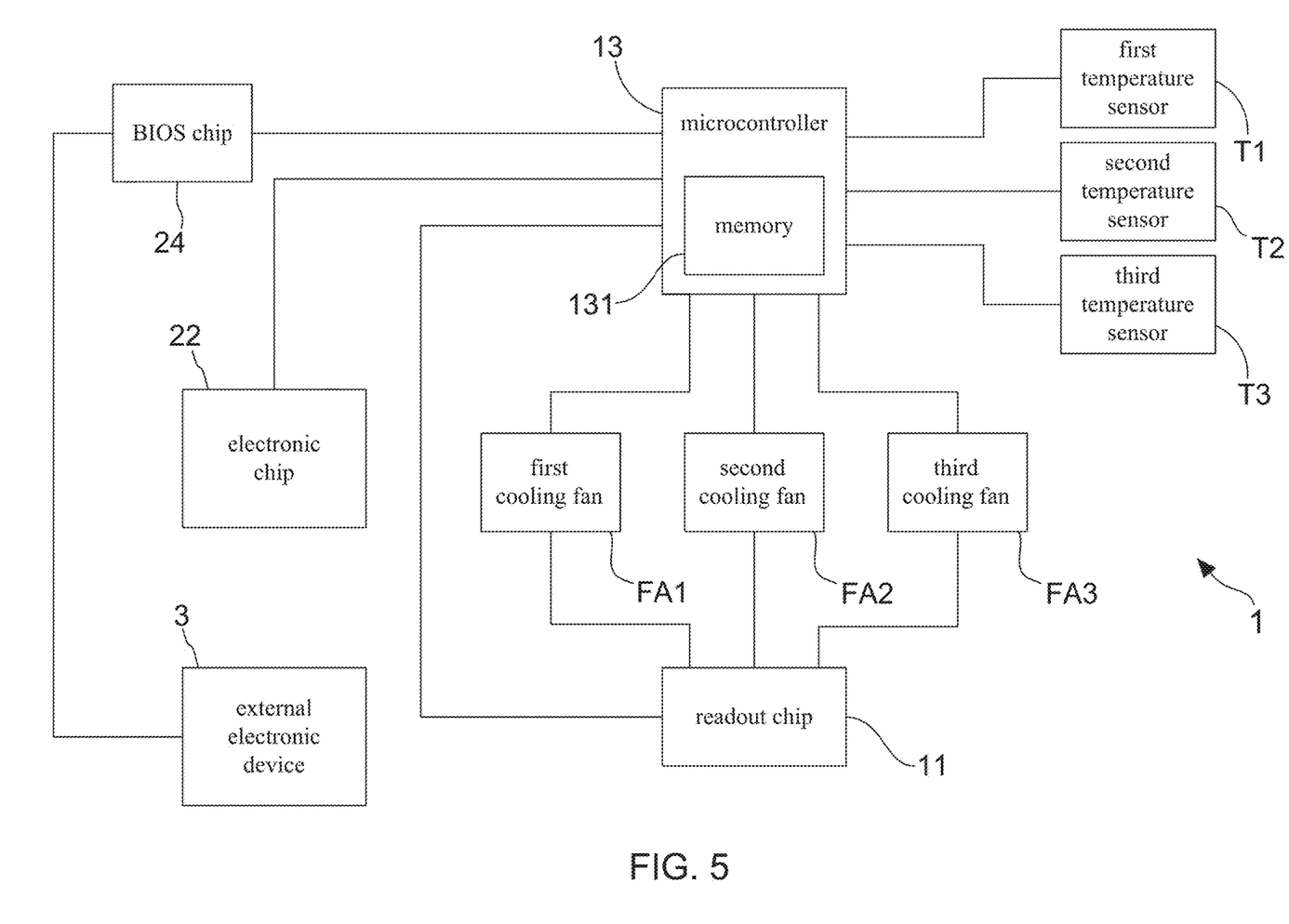
FIG. 5 shows a second block diagram of the smart cooling fan system according to the present invention.

With reference to FIG. 4, there is a second elevation view of the housing case accommodating the smart cooling fan system of the present invention therein. Moreover, FIG. 5 shows a second block diagram of the smart cooling fan system according to the present invention. After comparing FIG. 5 with FIG. 2, it is known that the second embodiment of the smart cooling fan system 1 further comprises a management unit 221 coupled to a BIOS chip 24 of the electronic device, wherein the management unit 221 is used for communicating with an external electronic device 3, such that the external electronic device 3 writes the at least one first lookup table, the second lookup table, the third lookup table, and the fourth lookup table into a storage space of the BIOS chip 24. Because a register is adopted as the memory 131 of the microcontroller 13 (i.e., CPLD or FPGA), such that the at least one first lookup table, the second lookup table, the third lookup table, and the fourth lookup table are loaded into the memory 131 from the storage space of the BIOS chip 24 after the microcontroller 13 is awakened.

In a practicable embodiment, the management unit 221 can be a platform security processor (PSP) proposed by AMD or an Intel management engine (IME), wherein the PSP and the IME are both remote controllable. In other words, the external electronic device 3 is allowed to write the at least one first LUT, the second LUT, the third LUT, and the fourth LUT into the storage space of the BIOS chip 24 through the management unit 221. In addition, the external electronic device 3 is also allowed to write a fan rotation speed controlling command into the storage space of the BIOS chip 24 through the management unit 221, so as to make the microcontroller 13 adjust the first volumetric flow rate of the first cooling fan FA1, the second volumetric flow rate of the second cooling fan FA2, and/or the third volumetric flow rate of the third cooling fan FA3 according to the fan rotation speed controlling command.

Therefore, through the above descriptions, all embodiments of the smart cooling fan system according to the present invention have been introduced completely and clearly. Moreover, the above description is made on embodiments of the present invention. However, the embodiments are not intended to limit the scope of the present invention, and all equivalent implementations or alterations within the spirit of the present invention still fall within the scope of the present invention.

What is claimed is:

1. A smart cooling fan system, being disposed in a housing case of an electronic device, and comprising:
    at least one first cooling fan, being disposed in the housing case, and being installed on or near at least one electronic chip; wherein the at least one first cooling fan has a rotations per minute (RPM) signal outputting terminal and a pulse width modulation (PWM) signal inputting terminal;
    at least one first temperature sensor, being disposed in the housing case for sensing a first temperature of the at least one electronic chip;

at least one second cooling fan, being disposed in the housing case, and being used for exhausting a hot air produced in the housing case or feeding an external air into the housing case; wherein the at least one second cooling fan also has a RPM signal outputting terminal and a PWM signal inputting terminal;

at least one second temperature sensor, being disposed in the housing case for sensing a second temperature of an inner space of the housing case; and a microcontroller, having a memory and being selected from a group consisting of complex programmable logic device (CPLD) and field programmable gate array (FPGA), and being coupled to the at least one first temperature sensor, the at least one second temperature sensor, the RPM signal outputting terminal and the PWM signal inputting terminal of the at least one first cooling fan, and the RPM signal outputting terminal and the PWM signal inputting terminal of the at least one second cooling fan;

wherein the memory stores a plurality of lookup tables, and the plurality of lookup tables comprising:

three first lookup tables, wherein one of the three first lookup tables records, corresponding to the at least one first cooling fan, a plurality of first volumetric flow rates and a plurality of first fan rotation speed corresponding to the plurality of first volumetric flow rates, and one of the three first lookup tables records, corresponding to the at least one second cooling fan, a plurality of second volumetric flow rates and a plurality of second fan rotation speed corresponding to the plurality of second volumetric flow rates;

a second lookup table, recording L number of first duty cycle analog values and L number of first temperature values corresponding to the L number of first duty cycle analog values, L being a positive integer; and a third lookup table, recording M number of second duty cycle analog values and M number of second temperature values corresponding to the M number of second duty cycle analog values, M being a positive integer;

wherein during a normal operation of the at least one first cooling fan and the at least one second cooling fan, the microcontroller receiving a first immediate rotation speed of the at least one first cooling fan and a second immediate rotation speed of the at least one second cooling fan;

wherein after receiving a data of the first temperature sensed by the at least one first temperature sensor, the microcontroller finding out one of the L number of first duty cycle analog values corresponding to the first temperature value from the second lookup table, and then generating and transmitting, according to the first duty cycle analog value, a first PWM signal with a first duty cycle to the PWM signal inputting terminal of the at least one first cooling fan, thereby controlling the at least one first cooling fan to produce a first airflow with a one of the plurality of first volumetric flow rates;

wherein after receiving a data of the second temperature sensed by the at least one second temperature sensor, the microcontroller finding out one of the M number of second duty cycle analog values corresponding to the second temperature value from the third lookup table, and then generating and transmitting, according to the second duty cycle analog value, a second PWM signal with a second duty cycle to the PWM signal inputting terminal of the at least one second cooling fan, thereby controlling the at least one second cooling fan to produce a second airflow with one of the plurality of second volumetric flow rates.

2. The smart cooling fan system of claim 1, wherein the at least one electronic chip is selected from a group consisting of CPU, GPU, digital signal processor (DSP), and application processor.

3. The smart cooling fan system of claim 2, wherein the at least one first temperature sensor is a thermal diode coupled to the at least one electronic chip.

4. The smart cooling fan system of claim 3, wherein the microcontroller communicates with the at least one electronic chip through a platform environment control interface (PECI), such that the at least one electronic chip transmits the data of the first temperature sensed by the first temperature sensor to the microcontroller.

5. The smart cooling fan system of claim 2, wherein the at least one first temperature sensor is a thermal diode integrated in the at least one electronic chip.

6. The smart cooling fan system of claim 2, wherein the microcontroller communicates with the at least one electronic chip through a platform environment control interface (PECI), such that the at least one electronic chip transmits the data of the first temperature sensed by the first temperature sensor to the microcontroller.

7. The smart cooling fan system of claim 1, wherein the electronic device is selected from a group consisting of server, cloud computing device, industrial computer, desktop computer, laptop computer, and all-in-one computer.

8. The smart cooling fan system of claim 1, wherein a readout chip is coupled to the microcontroller, the RPM signal outputting terminal of the at least one first cooling fan, and the RPM signal outputting terminal of the at least one second cooling fan, such that the microcontroller receives the first immediate rotation speed of the at least one first cooling fan and the second immediate rotation speed of the at least one second cooling fan through the readout chip.

9. The smart cooling fan system of claim 1, further comprising:

at least one third cooling fan, being disposed in the housing case, and being installed on or near at least one electronic module; wherein the at least one third cooling fan also has a RPM signal outputting terminal and a PWM signal inputting terminal;

at least one third temperature sensor, being disposed in the housing case for sensing a third temperature of the at least one electronic module;

wherein one of the three first lookup tables records, corresponding to the at least one third cooling fan, a plurality of third volumetric flow rates and a plurality of third fan rotation speed corresponding to the plurality of third volumetric flow rates;

wherein the plurality of lookup tables further comprises a fourth lookup table, recording N number of third duty cycle analog values and N number of third temperature values corresponding to the N number of third duty cycle analog values, N being a positive integer;

wherein during a normal operation of the at least one third cooling fan, the microcontroller receiving a third immediate rotation speed of the at least one third cooling fan;

wherein after receiving a data of the third temperature sensed by the at least one third temperature sensor, the microcontroller finding out one of the N number of third duty cycle analog values corresponding to the third temperature value from the fourth lookup table, and then generating and transmitting, according to the third duty cycle analog value, a third PWM signal with a third duty cycle to the PWM signal inputting terminal of the at least one third cooling fan, thereby controlling the at least one third cooling fan to produce a third airflow with one of the plurality of third volumetric flow rates.

10. The smart cooling fan system of claim 9, wherein the electronic module is selected from a group consisting of DRAM, hard disk drive and LED lighting device.

11. The smart cooling fan system of claim 9, further comprising a management unit coupled to a basic input/output system (BIOS) chip of the electronic device, wherein the management unit is used for communicating with an external electronic device, such that the external electronic device writes the three first lookup tables, the second lookup table, the third lookup table, and the fourth lookup table into a storage space of the BIOS chip.

12. The smart cooling fan system of claim 11, wherein a register is adopted as the memory of the microcontroller, such that the three first lookup tables, the second lookup table, the third lookup table, and the fourth lookup table are loaded into the memory from the storage space of the BIOS chip after the microcontroller is awakened.

13. The smart cooling fan system of claim 11, wherein the external electronic device is allowed to write a fan rotation speed controlling command into the storage space of the BIOS chip through the management unit, so as to make the microcontroller adjust the first volumetric flow rate of the first cooling fan, the second volumetric flow rate of the second cooling fan, and/or the third volumetric flow rate of the third cooling fan according to the fan rotation speed controlling command.

14. The smart cooling fan system of claim 11, wherein the management unit is selected from a group consisting of platform security processor (PSP) and Intel management engine (IME).

* * * * *